United States Patent
Hsieh et al.

(10) Patent No.: US 12,237,341 B2
(45) Date of Patent: Feb. 25, 2025

(54) DISPLAY PANEL

(71) Applicant: AUO Corporation, Hsinchu (TW)

(72) Inventors: Hsiu-Chun Hsieh, Hsinchu (TW); Shu-Hui Huang, Hsinchu (TW); Yi-Wei Chen, Hsinchu (TW)

(73) Assignee: AUO Corporation, Hsinchu (TW)

( * ) Notice: Subject to any disclaimer, the term of this patent is extended or adjusted under 35 U.S.C. 154(b) by 188 days.

(21) Appl. No.: 18/089,538

(22) Filed: Dec. 27, 2022

(65) Prior Publication Data

US 2024/0194692 A1 Jun. 13, 2024

(30) Foreign Application Priority Data

Dec. 13, 2022 (TW) ................... 111147715

(51) Int. Cl.
*G02F 1/1362* (2006.01)
*G02F 1/1343* (2006.01)
*G02F 1/1368* (2006.01)
*H01L 27/12* (2006.01)

(52) U.S. Cl.
CPC ...... *H01L 27/124* (2013.01); *G02F 1/134309* (2013.01); *G02F 1/136209* (2013.01); *G02F 1/136286* (2013.01); *G02F 1/1368* (2013.01)

(58) Field of Classification Search
CPC ............. H01L 27/124; G02F 1/134309; G02F 1/136209; G02F 1/136286; G02F 1/1368
See application file for complete search history.

(56) References Cited

U.S. PATENT DOCUMENTS

| | | |
|---|---|---|
| 5,182,620 A | 1/1993 | Shimada et al. |
| 5,600,155 A | 2/1997 | Wu |
| 6,618,033 B2 | 9/2003 | Takafuji |
| 6,781,321 B2 | 8/2004 | Ko et al. |
| 6,940,476 B2 | 9/2005 | Ko |
| 7,667,674 B2 | 2/2010 | Sato et al. |
| 7,924,352 B2 | 4/2011 | Hsiao et al. |
| 2005/0179040 A1 | 8/2005 | Tanaka |
| 2015/0109266 A1* | 4/2015 | Hong ................ G02F 1/136286 345/103 |
| 2018/0284508 A1 | 10/2018 | Hsieh et al. |
| 2018/0314124 A1* | 11/2018 | Dong ................ G02F 1/136286 |

* cited by examiner

*Primary Examiner* — James A Dudek
(74) *Attorney, Agent, or Firm* — JCIPRNET

(57) ABSTRACT

A display panel includes a substrate, first, second, and third data lines, scan lines, a first active device, a second active device, and pixel electrodes. The first and the third data lines have a first polarity. The second data line has a second polarity. The first polarity is different from the second polarity. A source electrode of the first active device disposed between the first data line and the second data line is electrically connected to the first data line. An extension region of the semiconductor pattern of the first active device extends toward and overlaps the second data line. A source electrode of the second active device disposed between the second data line and the third data line is electrically connected to the second data line. An extension region of the semiconductor pattern of the second active device extends toward and overlaps the third data line.

20 Claims, 6 Drawing Sheets

DISPLAY PANEL

CROSS-REFERENCE TO RELATED APPLICATION

This application claims the priority benefit of Taiwan application serial no. 111147715, filed on Dec. 13, 2022. The entirety of the above-mentioned patent application is hereby incorporated by reference herein and made a part of this specification.

BACKGROUND

Technical Field

The disclosure relates to a display technology; more particularly, the disclosure relates to a display panel.

Description of Related Art

In general, how liquid crystal molecules are arranged in a liquid crystal display (LCD) panel is changed by pixel electrodes in each pixel region, and different gray-scale display effects are achieved by adjusting a polarization state of light. In order to meet endurance requirements of electronic products (such as notebook computers, tablet computers, smart phones, and so on), a frame rate of the LCD panel may be decreased according to usage scenarios to reduce operating power consumption.

However, the current configuration of the pixel electrodes easily leads to capacitive coupling effects with adjacent signal lines, and switch devices configured to control the pixel electrodes are easily subject to light irradiation to generate leakage currents. Besides, voltage levels applied by the pixel electrodes tend to be shifted within one image scan period, thus resulting in an image flicker issue when images are displayed. Especially when the LCD panel runs at a relatively low frame rate (such as 20 Hz), the image flicker issue becomes more critical, which poses a negative impact on display quality.

SUMMARY

The disclosure relates to a display panel which is not easily subject to an image flicker issue with a relatively low frame rate.

According to an embodiment of the disclosure, a display panel including a substrate, a plurality of data lines, a plurality of scan lines, a plurality of active devices, and a plurality of pixel electrodes is provided. The data lines are arranged at intervals on the substrate and includes a first data line, a second data line, and a third data line disposed in sequence. Each of the first data line and the third data line has a first polarity, the second data line has a second polarity, and the first polarity is different from the second polarity. The scan lines are arranged at intervals on the substrate, and the data lines and the scan lines are intersected to define a plurality of pixel regions. The active devices are respectively disposed in the pixel regions, and each of the active devices includes a semiconductor pattern, a source electrode, a drain electrode, and a gate electrode. The gate electrode is electrically connected to one of the scan lines. The semiconductor pattern has a source region and a drain region respectively connected to the source electrode and the drain electrode, a channel region connected between the source region and the drain region, and an extension region extending from the drain region. A first active device of the active devices is disposed between the first data line and the second data line, where the source electrode of the first active device is electrically connected to the first data line, and the extension region of the semiconductor pattern of the first active device extends toward the second data line and overlaps the second data line. A second active device of the active devices is disposed between the second data line and the third data line, where the source electrode of the second active device is electrically connected to the second data line, and the extension region of the semiconductor pattern of the second active device extends toward the third data line and overlaps the third data line. The pixel electrodes are respectively disposed in the pixel regions and electrically connected to the drain electrodes of the active devices, respectively.

According to an embodiment of the disclosure, a display panel including a substrate, a plurality of first data lines, a plurality of second data lines, a plurality of scan lines, aa first pixel structure, and a second pixel structure is provided. The first data lines and the second data lines are alternately arranged on the substrate, where each of the first data lines has a first polarity, each of the second data lines has a second polarity, and the first polarity is different from the second polarity. The scan lines are arranged at intervals on the substrate, where the scan lines intersect with the first data lines and the second data lines. The first pixel structure is disposed between one of the first data lines and one of the second data lines and has a first active device and a first pixel electrode. The first active device includes a first semiconductor pattern, a first source electrode, a first drain electrode, and a first gate electrode. The first source electrode is electrically connected to the one of the first data lines and a first source region of the first semiconductor pattern, the first drain electrode is electrically connected to the first pixel electrode and a first drain region of the first semiconductor pattern, and the first gate electrode overlaps a first channel region of the first semiconductor pattern. The first channel region is connected between the first source region and the first drain region. The second pixel structure is disposed between the one of the second data lines and another of the first data lines and has a second active device and a second pixel electrode. The second active device includes a second semiconductor pattern, a second source electrode, a second drain electrode, and a second gate electrode. The second source electrode is electrically connected to the one of the second data lines and a second source region of the second semiconductor pattern, the second drain electrode is electrically connected to the second pixel electrode and a second drain region of the second semiconductor pattern, and the second gate electrode overlaps a second channel region of the second semiconductor pattern. The second channel region is connected between the second source region and the second drain region. The first semiconductor pattern has a first extension region extending from the first drain region, and the second semiconductor pattern has a second extension region extending from the second drain region. The first extension region of the first semiconductor pattern extends towards the one of the second data lines and overlaps the one of the second data lines, and the second extension region of the second semiconductor pattern extends towards the another of the first data lines and overlaps the another of the first data lines.

In view of the above, in the display panel provided in one or more embodiments of the disclosure, two data lines with the opposite polarities are disposed on two respective sides of the active device, and the active device is electrically connected to one of the two data lines. The semiconductor pattern of the active device extends toward the other data line and overlaps the other data line, so that an amount of potential shift of the pixel electrode electrically connected to the active device may be reduced when the display panel is operated at a low frame rate (e.g., 20 Hz), which is conducive to solving the image flicker issue.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
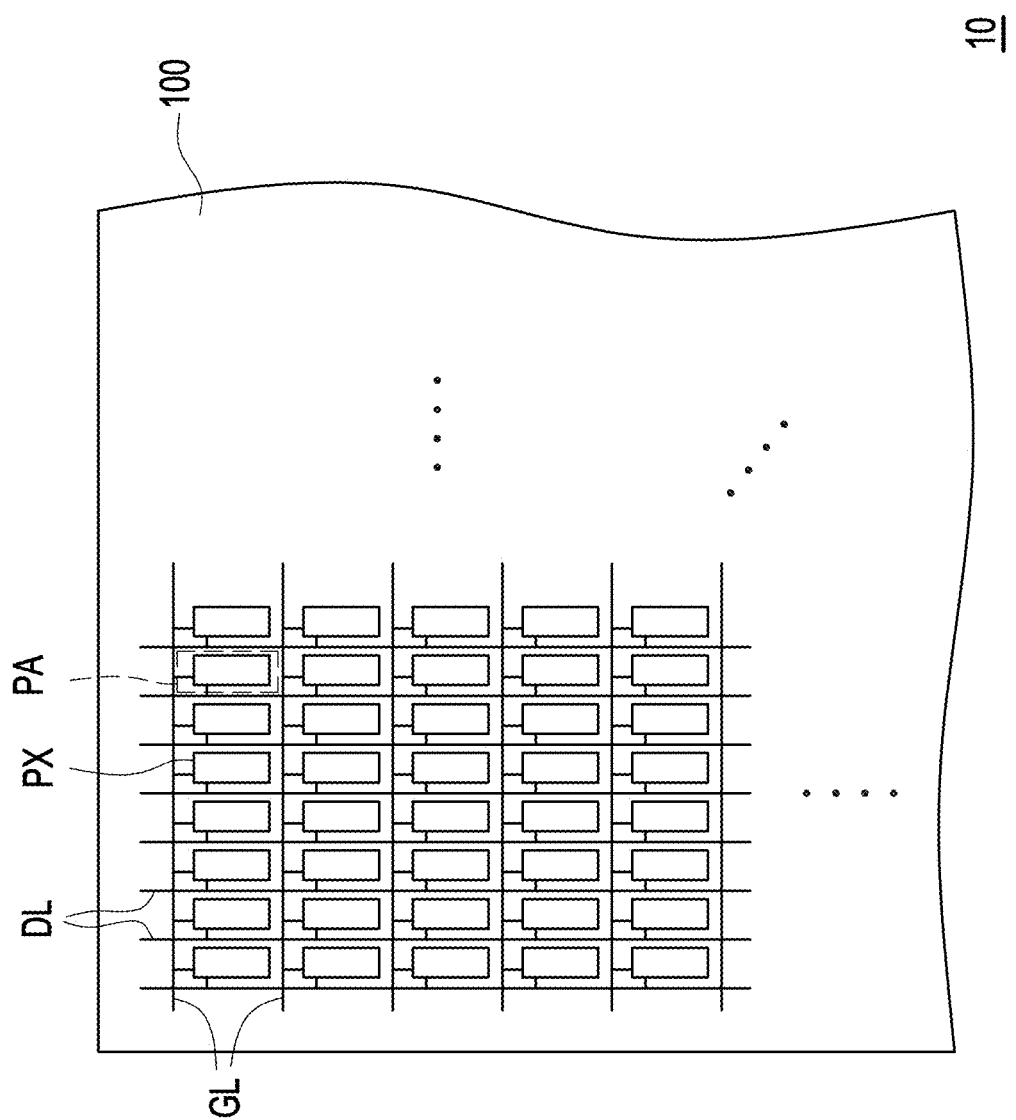
FIG. 1 is a schematic front view of a display panel according to a first embodiment of the disclosure.

Considering the particular amount of measurement and measurement-related errors discussed (i.e., the limitations of the measurement system), the terminology "about," "approximately," "essentially," or "substantially" used herein includes the average of the stated value and an acceptable range of deviations from the particular value as determined by those skilled in the art. For instance, the terminology "about" may refer to as being within one or more standard deviations of the stated value, or within ±30%, ±20%, ±15%, ±10%, or ±5%. Furthermore, the terminology "about," "approximately," "essentially," or "substantially" as used herein may be chosen from a range of acceptable deviations or standard deviations depending on the optical properties, etching properties, or other properties, rather than one standard deviation for all properties.

In the accompanying drawings, the thickness of layers, films, panels, regions, and so forth are enlarged for clarity. It should be understood that when an element, such as a layer, a film, a region, or a substrate is referred to as being "on" or "connected to" another element, it can be directly on or connected to the another element, or an intermediate element may also be present. By contrast, when an element is referred to as being "directly on" or "directly connected to" another element, no intermediate element is present. As used herein, being "connected" may refer to a physical and/or electrical connection. Furthermore, being "electrically connected" may refer to the presence of other elements between the two elements.

Furthermore, relative terminologies, such as "lower" or "bottom" and "upper" or "top" may be used herein to describe the relationship between one element and another element, as shown in the drawings. It should be understood that relative terminologies are intended to encompass different orientations of the device in addition to the orientation shown in the drawings. For instance, if a device in one of the accompanying drawings is turned upside down, elements described as being on the "lower" side of other elements would then be oriented on the "upper" sides of the other elements. Thus, the exemplary terminology "lower" may include an orientation of being on the "lower" side and the "upper" side, depending on the particular orientation of the accompanying drawings. Similarly, if the device in one of the accompanying drawings is turned upside down, elements described as being "below" or "beneath" other elements would then be oriented "above" the other elements. Thus, the exemplary terminology "below" or "beneath" may encompass an orientation of being above and below.

Exemplary embodiments are described herein with reference to the cross-sectional schematic views illustrating idealized embodiments. Therefore, variations of shapes resulting from the manufacturing technologies and/or tolerances, for instance, are to be expected. Therefore, the embodiments described herein should not be construed as being limited to the particular shapes of regions as illustrated herein but are to include deviations in shapes that result from manufacturing, for example. For instance, regions shown or described as being flat may typically have rough and/or non-linear features. Besides, the acute angle as shown may be round. Therefore, the regions shown in the drawings are schematic in nature, and their shapes are not intended to show the exact shape of the regions, and are not intended to limit the scope of the claims.

Reference will now be made in detail to the exemplary embodiments of the disclosure, examples of which are illustrated in the accompanying drawings. Whenever possible, the same reference numbers are used in the drawings and the description to refer to the same or like parts.

Figure 2:
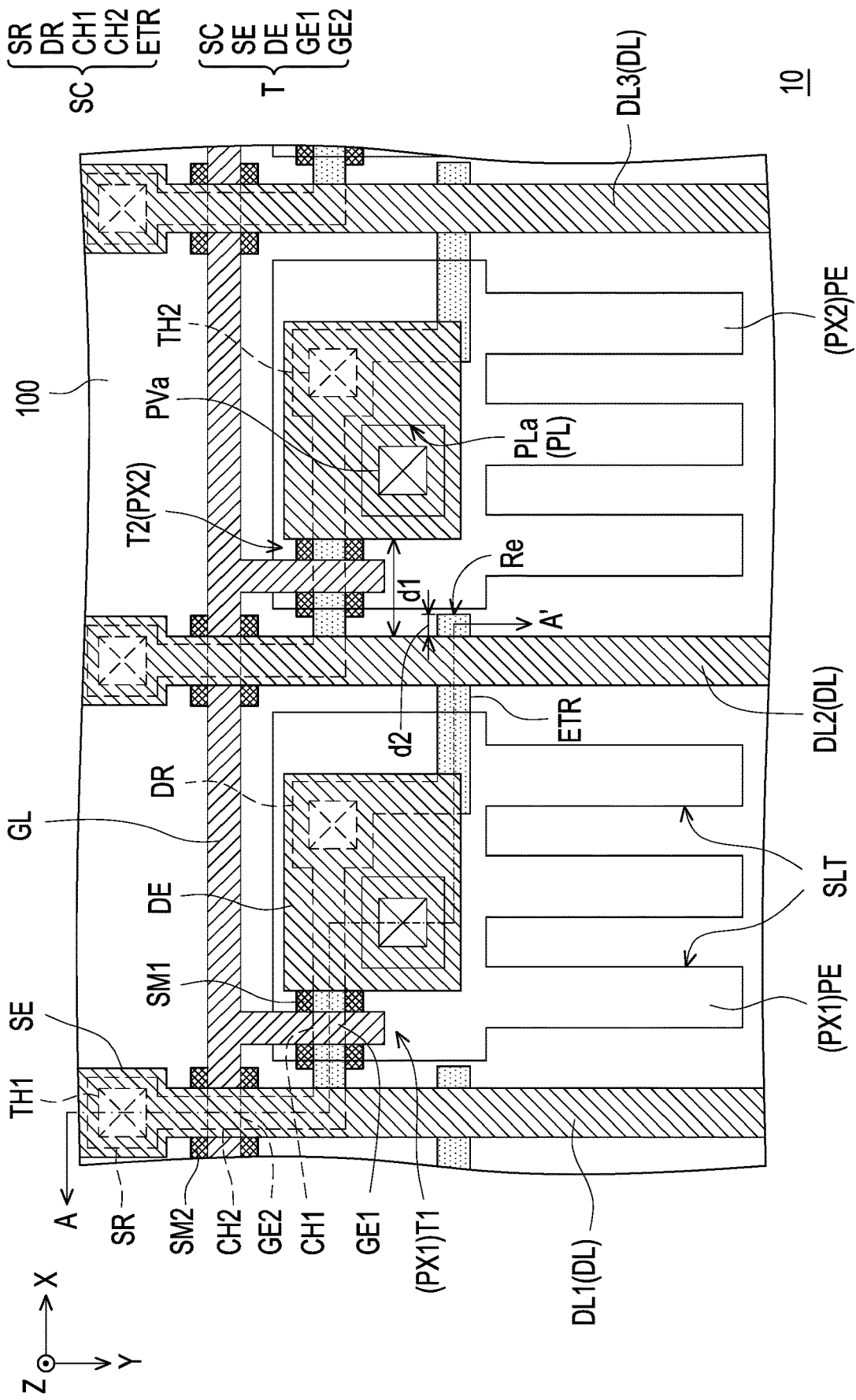
FIG. 2 is a schematic enlarged view of a partial region of the display panel depicted in FIG. 1.
Figure 3:
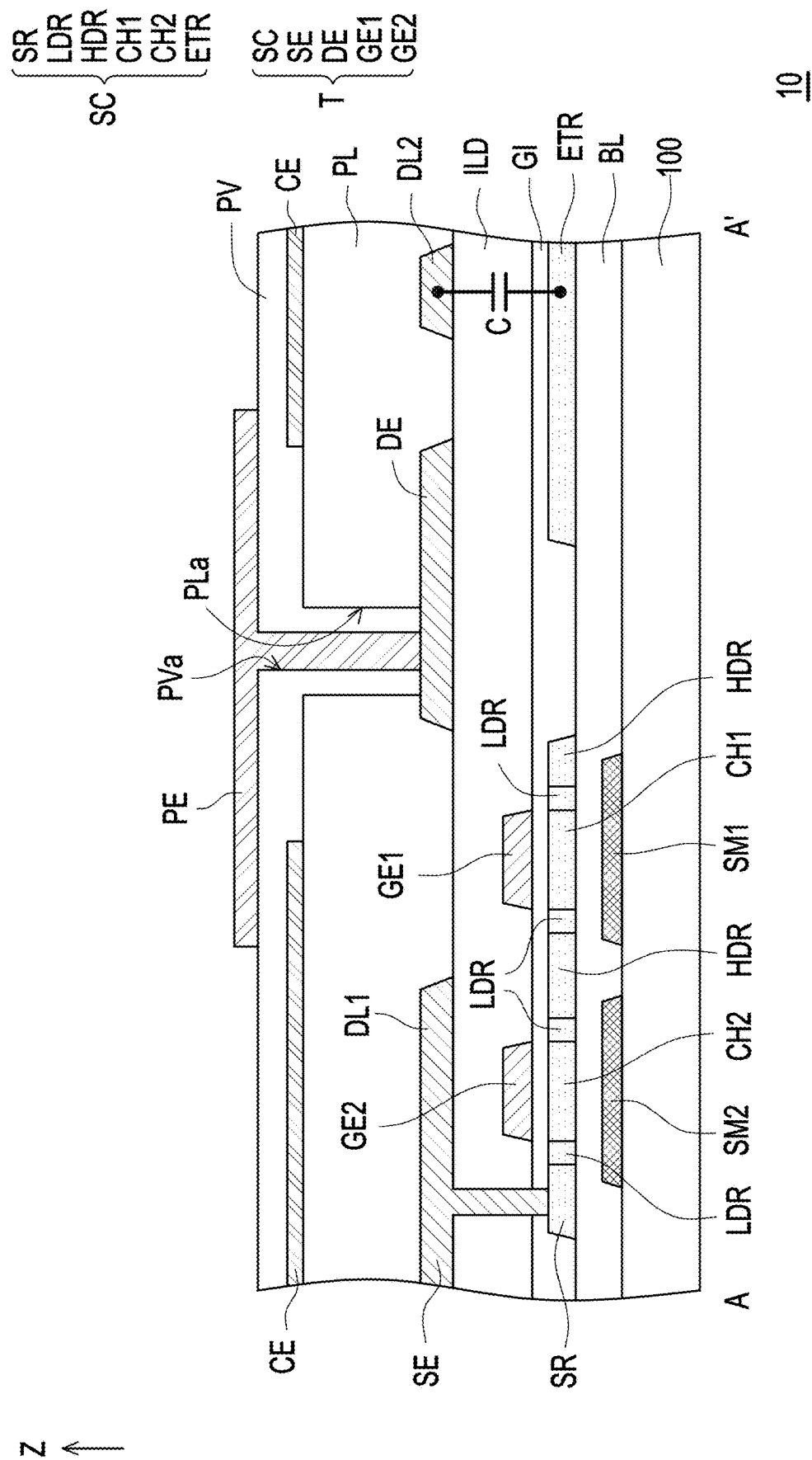
FIG. 3 is a schematic cross-sectional view of the display panel depicted in FIG. 2.

FIG. 1 is a schematic front view of a display panel according to a first embodiment of the disclosure. FIG. 2 is a schematic enlarged view of a partial region of the display panel depicted in FIG. 1. FIG. 3 is a schematic cross-sectional view of the display panel depicted in FIG. 2 along a section line A-A'. For clear illustration, a lightly doped region LDR and a heavily doped region HDR of a semiconductor pattern SC in FIG. 3 are omitted in FIG. 2.

With reference to FIG. 1, a display panel 10 includes a substrate 100, a plurality of scan lines GL, a plurality of data lines DL, and a plurality of pixel structures PX. In this embodiment, the data lines DL may be arranged at intervals in an X direction on substrate 100 and extend in an Y direction, and the scan lines GL may be arranged at intervals in the Y direction on the substrate 100 and extend in the X direction. Specifically, the scan lines GL and the data lines DL are intersected to define a plurality of pixel regions PA. The pixel structures PX are respectively disposed in the pixel regions PA, and each of the pixel structures PX is electrically connected to a corresponding scan line GL and a corresponding data line DL.

In particular, polarities of any two neighboring data lines DL are different from each other (e.g., the polarity is reversed). With reference to FIG. 2, in this embodiment, the display panel 10 may include a data line DL1, a data line DL2, and a data line DL3 which are sequentially aligned along the X direction and arranged adjacent to one another. The data line DL1 and the data line DL3 have a first polarity, the data line DL2 has a second polarity, and the first polarity and the second polarity are opposite to each other. For instance, the first polarity of the data line DL1 and the data line DL3 may be positive, and the second polarity of the data line DL2 may be negative, which should however not be construed as a limitation in the disclosure. In other embodiments, the first polarity of the data line DL1 and the data line DL3 may be negative, and the second polarity of the data line DL2 may be positive.

Alternatively, in a first frame period, the first polarity of the data line DL1 and the data line DL3 may be positive, and the second polarity of the data line DL2 may be negative; in a second frame period following the first frame period, the first polarity of the data line DL1 and the data line DL3 may be reversed to be negative, and the second polarity of the data line DL2 may be reversed to be positive. As long as the polarities of two adjacent data lines DL remain opposite, it falls within the scope of protection provided herein.

With reference to FIG. 2 and FIG. 3, the pixel structures PX may have active devices T and pixel electrodes PE which are electrically connected. Each of the active devices T may include a semiconductor pattern SC, a source electrode SE, a drain electrode DE, and a gate electrode GE1, where the gate electrode GE1 is electrically connected to a corresponding scan line GL, and one terminal of the source electrode SE and one terminal of the drain electrode DE are electrically connected to different regions of the semiconductor pattern SC. The other terminal of the source electrode SE is electrically connected to a corresponding data line DL, and the other terminal of the drain electrode DE is electrically connected to the pixel electrode PE. In this embodiment, the gate electrode GE1 is constituted by a portion of the scan line GL extending along the Y direction, for instance. The semiconductor pattern SC has a source region SR, a drain region DR, and a channel region CH1. The channel region CH1 is connected between the source region SR and the drain region DR and overlaps the gate electrode GE1. Here, the overlapping relationship between the channel region CH1 and the gate electrode GE1 is defined along a Z direction, for instance. Unless otherwise mentioned below, the overlapping relationship between any two components is defined in the same way and thus will not be further explained hereinafter.

From another point of view, the semiconductor pattern SC may be divided into the channel region CH1, a plurality of lightly doped regions LDR, and a plurality of heavily doped regions HDR according to different doping degrees of specific elements. The lightly doped regions LDR are distributed on two opposite sides of the channel region CH1 and connect the channel region CH1 to the heavily doped regions HDR. A portion of the heavily doped regions HDR may serve as the source region SR and the drain region DR electrically connecting the source electrode SE and the drain electrode DE. That is, resistance values of the heavily doped regions HDR, the source region SR, and the drain region DR of the semiconductor pattern SC are identical.

In this embodiment, note that the source electrode SE and the drain electrode DE of the active device T may be respectively disposed on two opposite sides of the scan line GL. Hence, an extension path of the semiconductor pattern SC not only overlaps the gate electrode GE1 but overlaps the scan line GL. In particular, according to this embodiment, an orthogonal projection of an extension portion of the semiconductor pattern SC from the drain region DR to the source region SR on the substrate 100 is substantially shaped as a letter L, which should however not be construed as a limitation in the disclosure.

In this embodiment, the overlapping portion of the scan line GL and the semiconductor pattern SC may serve as another gate electrode GE2 of the active device T. By contrast, the overlapping portion of the semiconductor pattern SC and the scan line GL may serve as another channel region CH2 of the semiconductor pattern SC, and the two opposite sides of the channel region CH2 may also be connected to the lightly doped regions LDR. In another aspect, the overlapping portion of the data line DL and the source region SR of the semiconductor pattern SC may serve as the source electrode SE of the active device T, which should however not be construed as a limitation in the disclosure. In another embodiment, the source electrode of the active device may also be constituted by a protruding portion of the data line DL.

In this embodiment, the gate electrode GE1 and the gate electrode GE2 of the active device T may be selectively disposed above the semiconductor pattern SC to form a top-gate thin film transistor (top-gate TFT), which should however not be construed as a limitation in the disclosure. According to other embodiments, the gate electrode GE1 and the gate electrode GE2 of the active device may also be disposed below the semiconductor pattern SC to form a bottom-gate electrode thin film transistor (bottom-gate TFT). In another aspect, a material of the semiconductor pattern SC provided in this embodiment may include a polysilicon semiconductor material; that is, the active device T may be a low temperature polysilicon thin film transistor (LTPS TFT). However, the disclosure is not limited to thereto, and in other embodiments, the active device may also be an amorphous silicon thin film transistor (a-Si TFT), a micro-silicon thin film transistor (micro-Si TFT), a metal oxide transistor, an oxynitride semiconductor, an organic semiconductor, a combination of the foregoing, or other appropriate materials.

A step of forming the active device T may include: sequentially forming a buffer layer BL, the semiconductor pattern SC, a gate insulation layer GI, the gate electrode GE1 and the gate electrode GE2, an interlayer insulation layer ILD, the source electrode SE, and the drain electrode DE on the substrate 100, where the source electrode SE and the drain electrode DE are electrically connected to the source region SR and the drain region DR of the semiconductor pattern SC through a through hole TH1 and a through hole TH2 of the interlayer insulation layer ILD and the gate insulation layer GI, respectively.

Note that the gate electrode GE1, the gate electrode GE2, the source electrode SE, the drain electrode DE, the buffer layer BL, the gate insulation layer GI, the interlayer insulation layer ILD, and a planarization layer PL may be implemented in form of any gate electrode, any source electrode, any drain electrode, any buffer layer, any gate insulation layer, any interlayer insulation layer, and any planarization layer applied in a display panel and well known to people having ordinary skill in the pertinent art, and the gate electrode GE1, the gate electrode GE2, the source electrode SE, the drain electrode DE, the buffer layer BL, the gate insulation layer GI, the interlayer insulation layer ILD, and the planarization layer PL may be respectively formed by any method well known to people having ordinary skill in the pertinent art, and therefore no relevant explanation will be provided hereinafter.

In this embodiment, the display panel 10 may further include a plurality of common electrodes CE respectively overlapping the pixel electrodes PE of the pixel structures PX. For instance, a step of forming the common electrodes CE and the pixel electrodes PE may include: sequentially forming the planarization layer PL, the common electrodes CE, a passivation layer PV, and the pixel electrodes PE on the active devices T, where the pixel electrodes PE are electrically connected to the drain electrodes DE of the active devices T via an opening PLA of the planarization layer PL and an opening PVA of the passivation layer PV.

To be specific, the semiconductor pattern SC of the active device T further has an extension region ETR extending from the drain region DR. The extension region ETR of the semiconductor pattern SC of the active device T electrically connected to any of the data lines DL extends towards a direction away from the channel region CH1 and the source region SR of the active device T and overlaps another data line DL. In this embodiment, an orthogonal projection of the extension region ETR of the semiconductor pattern SC on the substrate 100 is substantially shaped as a letter L, which should however not be construed as a limitation in the disclosure.

For instance, as shown in FIG. 2, a first active device T1 and the pixel electrode PE of a first pixel structure PX1 are arranged between the data line DL1 and the data line DL2 of the display panel 10. The source electrode SE of the first active device T1 is electrically connected to the data line DL1. The extension region ETR of the semiconductor pattern SC of the first active device T1 extends toward the data line DL2 and overlaps the data line DL2. Similarly, a second active device T2 and the pixel electrode PE of a second pixel structure PX2 are arranged between the data line DL2 and the data line DL3. The source electrode SE of the second active device T2 is electrically connected to the data line DL2. The extension region ETR of the semiconductor pattern SC of the second active device T2 extends toward the data line DL3 extend and overlaps the data line DL3.

In this embodiment, the gate electrode GE1 of the first active device T1 of the first pixel structure PX1 and the gate electrode GE1 of the second active device T2 of the second pixel structure PX2 may be electrically connected to the same scan line GL, which should however not be construed as in the disclosure. In other embodiments not shown in the drawings, the gate electrodes of the respective active devices of two pixel structures adjacently arranged in the X direction may also be electrically connected to different scan lines.

Since the polarity of the data line DL1 is opposite to the polarity of the data line DL2, the amount of potential shift of the pixel electrode PE of the first pixel structure PX1 electrically connected to the data line DL1 through the first active device T1 in a frame period may be reduced by a compensation capacitor C formed by the overlapping data line DL2 and extension region ETR of the semiconductor pattern SC of the first active device T1 (i.e., a capacitor coupling effect). Similarly, since the polarity of the data line DL2 is opposite to the polarity of the data line DL3, the amount of potential shift of the pixel electrode PE of the second pixel structure PX2 electrically connected to the data line DL2 through the second active device T2 in a frame period may be reduced by the capacitor coupling effect generated by the overlapping data line DL3 and extension region ETR of the semiconductor pattern SC of the second active device T2. Accordingly, the image flicker issue resulting from the display panel 10 which is operated at a relatively low frame rate (e.g., 20 Hz) may be better resolved, thereby improving the display quality.

With reference to FIG. 2, in this embodiment, the extension region ETR of the semiconductor pattern SC of the first active device T1 of the first pixel structure PX1 may further extend to a pixel region where the second pixel structure PX2 is disposed. That is, the extension region ETR of the semiconductor pattern SC of the first active device T1 may extend to one side of the data line DL2 where the second active device T2 is disposed. Similarly, the extension region ETR of the semiconductor pattern SC of the second active device T2 may extend to one side of the data line DL3 away from the second active device T2 (i.e., the side where a third active device is disposed).

In particular, a first distance d1 exists between the drain electrode DE of the second active device T2 and the data line DL2 in an arrangement direction (such as the X direction) of the data lines DL, and a second distance d2 exists between a side edge Re of the drain electrode DE closest to the second active device T2 and the data line DL2 in the X direction in the extension region ETR of the semiconductor pattern SC of the first active device T1. A ratio of the second distance d2 to the first distance d1 is less than 0.5 in an embodiment of the disclosure. For instance, when the first distance d1 is 9.5 micrometers, and when the display panel 10 is operated at a frame rate of 20 Hz, the flicker values corresponding to the second distances d2 of 0 micrometer, 1 micrometer, and 2 micrometers are −24 dB, −27 dB, and −27.3 dB, respectively.

That is, as long as the extension region ETR of the semiconductor pattern SC of the first active device T1 approaches the drain electrode DE of the second active device T2, the capacitor coupling effect between the extension region ETR of the semiconductor pattern SC of the first active device T1 and the data line DL2 having the opposite polarity and the drain electrode DE of the second active device T2 becomes more significant, which is conductive to solving the image flicker issue when the display panel 10 is operated at a relatively low frame rate (e.g., 20 Hz).

However, note that the extension region ETR of the semiconductor pattern SC of the first active device T1 does not overlap the semiconductor pattern SC and the drain electrode DE of the second active device T2, so as to prevent the capacitive coupling with the second active device T2 from affecting operational electrical properties of the second pixel structure PX2 (e.g., the potential of the pixel electrode PE of the second pixel structure PX2). From another perspective, the extension region ETR of the semiconductor pattern SC of the first active device T1 faces the side edge Re of the drain electrode DE of the second active device T2, and the side edge Re is located within a space between the data line DL2 and the drain electrode DE of the second active device T2.

Since the extension region ETR of the semiconductor pattern SC of the second active device T2 or another active device T is configured in the same manner as that of the first active device T1, details are not repetitively described hereinafter.

Particularly, the substrate 100 and each film layer thereon may constitute a pixel array substrate of the display panel 10, and the display panel 10 may further include a liquid crystal layer (not shown) and a color filter substrate (not shown), where the liquid crystal layer is sandwiched between the pixel array substrate and the color filter substrate. That is, the display panel 10 provided in this embodiment may be a liquid crystal display (LCD) panel. For instance, an electric field generated between the pixel electrodes PE and the common electrodes CE may serve to change the alignment status of a plurality of liquid crystal molecules, and then the polarization state of light beams passing through the liquid crystal layer is modulated to achieve different gray-scale display effects. Since the liquid crystal layer and the color filter substrate may be formed and arranged in the manner of forming and arranging any liquid crystal layer and any color filter substrate well known to people having ordinary skill in the pertinent art and applied in an LCD panel, no further explanation will be provided hereinafter.

In this embodiment, each of the pixel electrodes PE may have a plurality of slits SLT, and the common electrodes CE are located between the pixel electrodes PE and the substrate 100. More specifically, the pixel structures PX provided in this embodiment drive the liquid crystal layer in a fringe field switching (FFS) manner, for instance. However, the disclosure is not limited thereto. According to another embodiment, the pixel electrodes may also be disposed between the common electrodes and the substrate 100, and the common electrodes have a plurality of slits. According to still another embodiment, the common electrodes and the pixel electrodes may also be disposed on different substrates; that is, the pixel structures may also perform the driving operation in a vertical alignment (VA) manner. According to yet another embodiment, in addition to the architecture shown in FIG. 3, another common electrode may also be disposed on another substrate of the display panel; that is, the pixel structures perform the driving operation in a hybrid manner combining the FFS manner and the VA manner.

In another aspect, in order to prevent external ambient light from irradiating the channel region CH1 and the channel region CH2 of the semiconductor pattern SC, which may generate leakage current, the display panel 10 may selectively include a plurality of light shielding patterns, e.g., light shielding patterns SM1 and SM2 correspondingly disposed to each pixel structure PX. The light shielding pattern SM1 overlaps the channel region CH1 of the semiconductor pattern SC. The light shielding pattern SM2 overlaps the channel region CH2 of the semiconductor pattern SC'. In this embodiment, note that the channel region CH2 of the semiconductor pattern SC overlaps the scan line GL and the data line DL at the same time. That is, the light shielding patterns SM2 of the display panel 10 respectively overlap intersections of the scan lines GL and the data lines DL, such as intersections of the scan lines GL and respective data lines DL1, DL2, and DL3 as shown in FIG. 2, which should however not be construed as a limitation in the disclosure.

For instance, in this embodiment, the light shielding patterns SM1 and SM2 may be selectively disposed between the semiconductor pattern SC and the substrate 100 and covered by the buffer layer BL, which should however not be construed as a limitation in the disclosure.

Other embodiments are provided below for elaborations in the disclosure, where the same components are marked by the same reference numbers, and the description of the same technical content will be omitted. The omitted descriptions may be referred to as what is provided in the previous embodiments and thus will not be further provided hereinafter.

Figure 4:
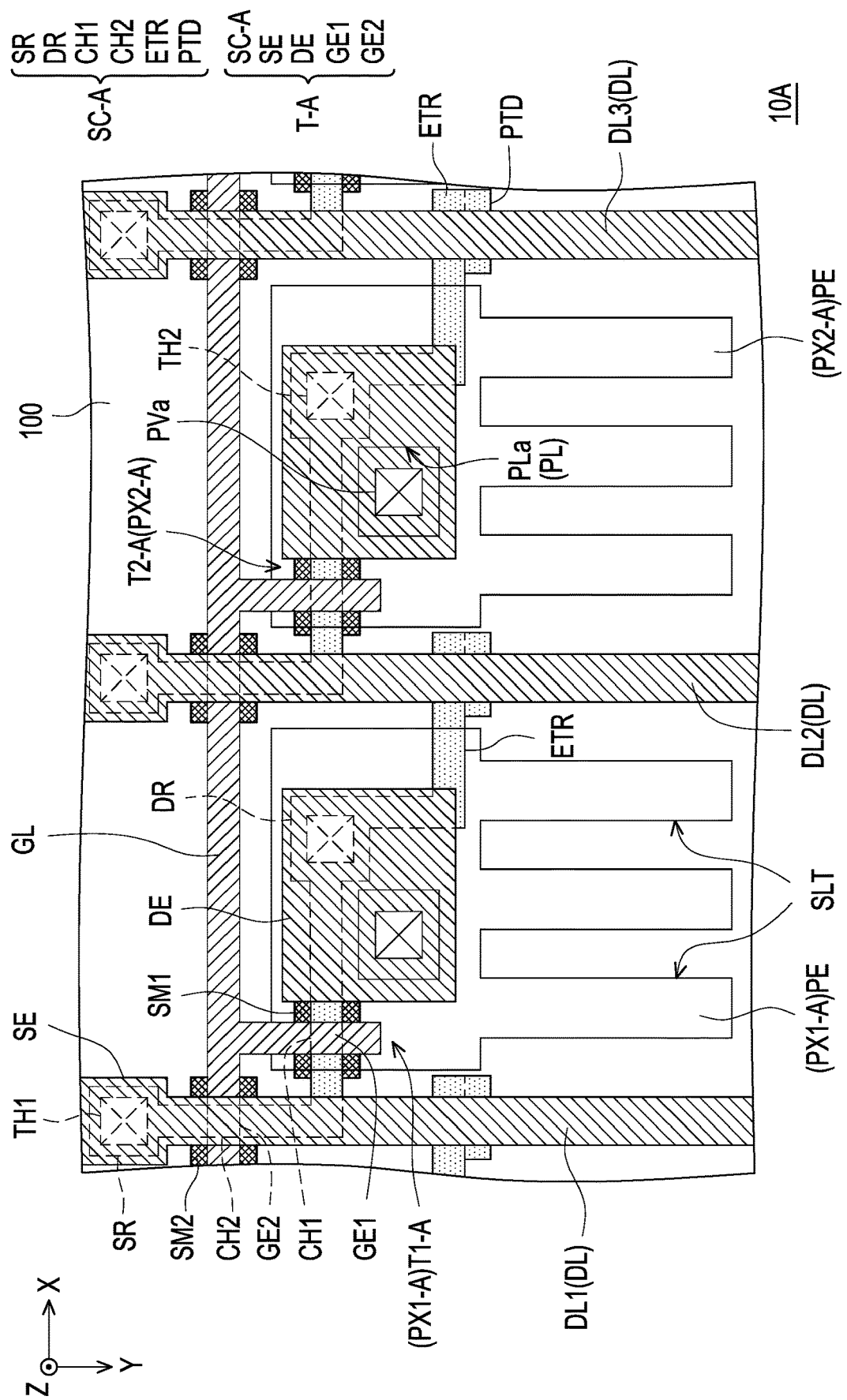
FIG. 4 is a schematic front view of a display panel according to a second embodiment of the disclosure.
Figure 5:
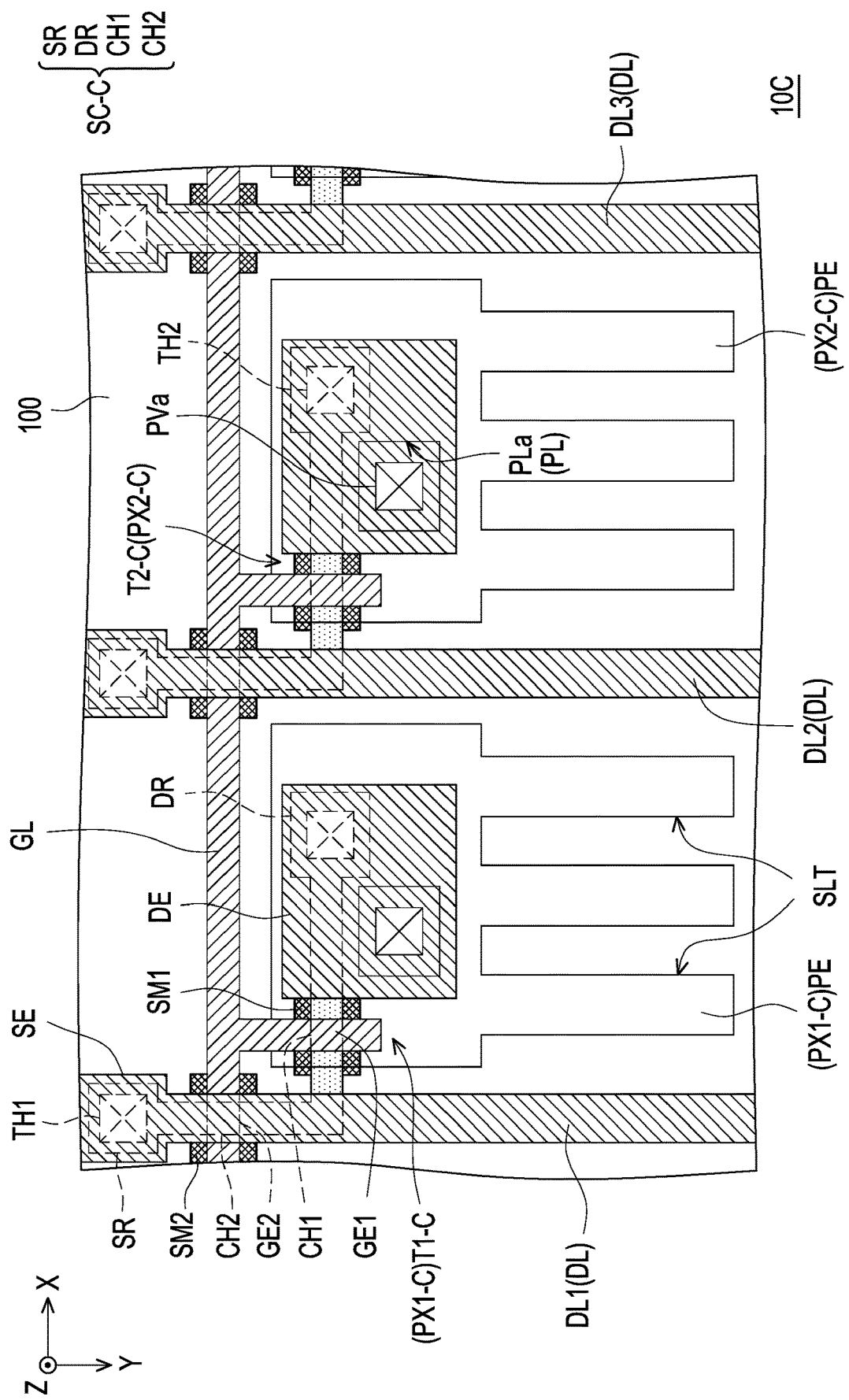
FIG. 5 is a schematic front view of a display panel according to a comparative example.
Figures 6A, 6B:
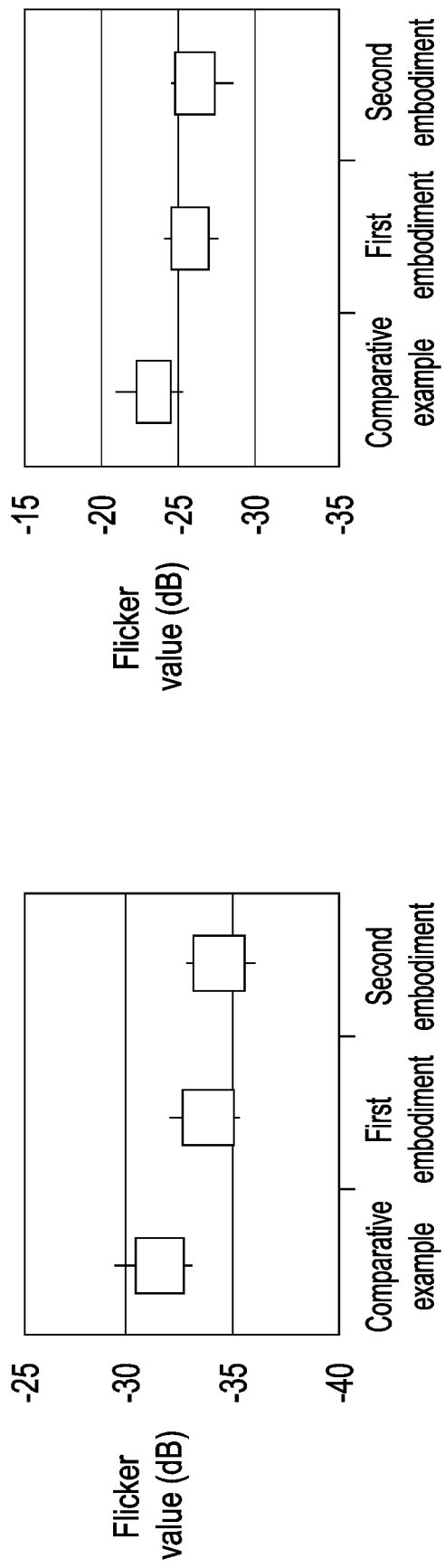
FIG. 6A is a diagram illustrating distributions of flicker values when the display panels provided in embodiments of the disclosure and in the comparative example are operated at a frame rate of 60 Hz.
FIG. 6B is a diagram illustrating distributions of flicker values when the display panels provided in embodiments of the disclosure and in the comparative example are operated at a frame rate of 20 Hz.

FIG. 4 is a schematic front view of a display panel according to a second embodiment of the disclosure. FIG. 5 is a schematic front view of a display panel according to a comparative example. FIG. 6A is a diagram illustrating distributions of flicker values when the display panels provided in embodiments of the disclosure and in the comparative example are operated at a frame rate of 60 Hz. FIG. 6B is a diagram illustrating distributions of flicker values when the display panels provided in embodiments of the disclosure and in the comparative example are operated at a frame rate of 20 Hz.

With reference to FIG. 4, the difference between a display panel 10A provided in this embodiment and the display panel 10 shown in FIG. 2 lies in the different configurations of the semiconductor patterns. Specifically, in this embodiment, a semiconductor pattern SC-A of the active device TA of the display panel 10A further has a protrusion PTD protruding from the extension region ETR and overlapping the data line DL.

For instance, in this embodiment, a portion of the extension region ETR of the semiconductor pattern SC-A of a first pixel structure PX1-A of a first active device T1-A overlapping the data line DL2' may further extend in an extension direction (e.g., the Y direction) of the data line DL2 to form the protrusion PTD, and a portion of the extension region ETR of the semiconductor pattern SC-A of a second pixel structure PX2-A of a second active device T2-A overlapping the data line DL3 may also extend in an extension direction of the data line DL3 to form the protrusion PTD.

From another perspective, the extension region ETR of the semiconductor pattern SC-A provided in this embodiment extends from one side (e.g., a lower side in FIG. 4) along the extension direction of the data line DL to form the protrusion PTD overlapping the data line DL, which should however not be construed as a limitation in the disclosure. In another embodiment, the protrusion of the semiconductor pattern may also extend from an upper side of the extension region ETR.

With reference to FIG. 6A and FIG. 6B, compared to the display panel 10 provided in the first embodiment, the display panel 10A provided in this embodiment (i.e., the second embodiment) has an additional protrusion PTD resulting from the semiconductor pattern SC-A, and therefore improved flicker values may be obtained no matter whether the frame rate is 60 Hz or 20 Hz. In addition, both the display panel 10 provided in the first embodiment and the display panel 10A provided in the second embodiment apparently have better flicker values at the frame rate of 60 Hz or 20 Hz than the flicker value of a display panel 10C provided in the comparative example. In the comparative example, a semiconductor pattern SC-C of a first active device T1-C of a first pixel structure PX1-C (or the semiconductor pattern SC-C of a second active device T2-C of a second pixel structure PX2-C of a display panel 10C (shown in FIG. 5) does not have the extension region ETR which is included in the display panel 10 shown in FIG. 2. Namely, in the display panel 10C provided in the comparative example, the semiconductor pattern SC-C of the first active device T1-C does not overlap the data line DL2 having the opposite polarity, and the semiconductor pattern SC-C of the second active device T2-C does not overlap the data line DL3 having the opposite polarity.

To sum up, in the display panel provided in one or more embodiments of the disclosure, two data lines with the opposite polarities are respectively disposed on the two opposite sides of the active device to each other, and the active device is electrically connected to one of the data lines. The semiconductor pattern of the active device extends toward the other data line and overlaps the other data line, so as to allow the amount of potential shift of the pixel electrode electrically connected to the active device to be reduced when the display panel is operated at a low frame rate (e.g., 20 Hz), which is conducive to solving the image flicker issue.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A display panel, comprising:
   a substrate;
   a plurality of data lines, arranged at intervals on the substrate and comprising a first data line, a second data line, and a third data line disposed in sequence, wherein each of the first data line and the third data line has a first polarity, the second data line has a second polarity, and the first polarity is different from the second polarity;
   a plurality of scan lines, arranged at intervals on the substrate, wherein the data lines and the scan lines are intersected to define a plurality of pixel regions;
   a plurality of active devices, respectively disposed in the pixel regions, each of the active devices comprising a semiconductor pattern, a source electrode, a drain electrode, and a gate electrode, wherein the gate electrode is electrically connected to one of the scan lines, the semiconductor pattern has a source region and a drain region respectively connected to the source electrode and the drain electrode, a channel region connected between the source region and the drain region, and an extension region extending from the drain region, the active devices comprising:
      a first active device, disposed between the first data line and the second data line, wherein the source electrode of the first active device is electrically connected to the first data line, and the extension region of the semiconductor pattern of the first active device extends toward the second data line and overlaps the second data line; and
      a second active device, disposed between the second data line and the third data line, wherein the source electrode of the second active device is electrically connected to the second data line, and the extension region of the semiconductor pattern of the second active device extends toward the third data line and overlaps the third data line; and
   a plurality of pixel electrodes, respectively disposed in the pixel regions and electrically connected to the drain electrodes of the active devices, respectively.

2. The display panel according to claim 1, where in the extension region of the semiconductor pattern of the first active device extends to one side of the second data line where the second active device is disposed.

3. The display panel according to claim 2, wherein the extension region of the semiconductor pattern of the second active device extends to one side of the third data line away from the second active device.

4. The display panel according to claim 2, wherein the extension region of the semiconductor pattern of the first active device does not overlap the semiconductor pattern and the drain electrode of the second active device.

5. The display panel according to claim 2, wherein a first distance exists between the drain electrode of the second active device and the second data line in an arrangement direction of the data lines, a second distance exists between a side edge of the drain electrode closest to the second active device and the second data line in the arrangement direction in the extension region of the semiconductor pattern of the first active device, and a ratio of the second distance to the first distance is less than 0.5.

6. The display panel according to claim 1, wherein the semiconductor pattern of each of the active devices further has a protrusion protruding from the extension region and overlapping one of the data lines.

7. The display panel according to claim 6, wherein a protruding direction of the protrusion is parallel to an extension direction of the data lines.

8. The display panel according to claim 1, further comprising:
   a plurality of common electrodes, respectively overlapping the pixel electrodes.

9. The display panel according to claim 8, wherein each of the pixel electrodes or each of the common electrodes has a plurality of slits.

10. The display panel according to claim 1, wherein the gate electrode of the first active device and the gate electrode of the second active device are electrically connected to a same one of the scan lines.

11. The display panel according to claim 1, wherein the semiconductor pattern of each of the active devices further has another channel region overlapping an intersection between one of the scan lines and one of the data lines.

12. The display panel according to claim 11, further comprising:
   a plurality of light shielding patterns, disposed on the substrate and overlapping the channel regions and a plurality of the another channel regions of the semiconductor patterns of the active devices.

13. The display panel according to claim 1, wherein a resistance value of the extension region, a resistance value of the drain region, and a resistance value of the source region of the semiconductor pattern are identical.

14. A display panel, comprising:
   a substrate;
   a plurality of first data lines and a plurality of second data lines, alternately arranged on the substrate, wherein each of the first data lines has a first polarity, each of the second data lines has a second polarity, and the first polarity is different from the second polarity;
   a plurality of scan lines, arranged at intervals on the substrate, wherein the scan lines intersect with the first data lines and the second data lines;
   a first pixel structure, disposed between one of the first data lines and one of the second data lines and having a first active device and a first pixel electrode, wherein the first active device comprises a first semiconductor pattern, a first source electrode, a first drain electrode, and a first gate electrode, the first source electrode is electrically connected to the one of the first data lines and a first source region of the first semiconductor pattern, the first drain electrode is electrically connected to the first pixel electrode and a first drain region of the first semiconductor pattern, the first gate electrode overlaps a first channel region of the first semiconductor pattern, and the first channel region is connected between the first source region and the first drain region; and
   a second pixel structure, disposed between the one of the second data lines and another of the first data lines and having a second active device and a second pixel electrode, wherein the second active device comprises a second semiconductor pattern, a second source electrode, a second drain electrode, and a second gate electrode, the second source electrode is electrically connected to the one of the second data lines and a second source region of the second semiconductor pattern, the second drain electrode is electrically connected to the second pixel electrode and a second drain region of the second semiconductor pattern, the second gate electrode overlaps a second channel region of the second semiconductor pattern, and the second channel region is connected between the second source region and the second drain region, wherein the first semiconductor pattern has a first extension region extending from the first drain region, the second semiconductor pattern has a second extension region extending from the second drain region, the first extension region of the first semiconductor pattern extends towards the one of the second data lines and overlaps the one of the second data lines, and the second extension region of the second semiconductor pattern extends towards the another of the first data lines and overlaps the another of the first data lines.

15. The display panel according to claim 14, wherein the first extension region of the first semiconductor pattern extends to one side of the one of the second data lines where the second drain electrode is disposed.

16. The display panel according to claim 15, wherein the second extension region of the second semiconductor pattern extends to one side of the another of the first data lines away from the second drain electrode.

17. The display panel according to claim 15, wherein the first extension region of the first semiconductor pattern does not overlap the second semiconductor pattern and the second drain electrode.

18. The display panel according to claim 15, wherein a first distance exists between the second drain electrode and the one of the second data lines in an arrangement direction of the second data lines, a second distance exists between a side edge of the second drain electrode closest to the second active device and the one of the second data lines in the arrangement direction in the first extension region of the first semiconductor pattern, and a ratio of the second distance to the first distance is less than 0.5.

19. The display panel according to claim 14, wherein the first semiconductor pattern further has a first protrusion protruding from the first extension region and overlapping the one of the second data lines, the second semiconductor pattern further has a second protrusion protruding from the second extension region and overlapping the another of the first data lines, and a protruding direction of the first protrusion and a protruding direction of the second protrusion are parallel to extension directions of the first data lines and the second data lines.

20. The display panel according to claim 14, further comprising:

a plurality of light shielding patterns, disposed on the substrate and overlapping the first channel region of the first semiconductor pattern, the second channel region of the second semiconductor pattern, intersections between the scan lines and the first data lines, and intersections between the scan lines and the second data lines.

* * * * *